(12) United States Patent
Ontalus et al.

(10) Patent No.: US 11,916,135 B2
(45) Date of Patent: Feb. 27, 2024

(54) BIPOLAR TRANSISTOR

(71) Applicant: GLOBALFOUNDRIES U.S. Inc., Malta, NY (US)

(72) Inventors: Viorel Ontalus, Unionville, CT (US); Justin C. Long, Poughkeepsie, NY (US); Robert K. Baiocco, Poughquag, NY (US)

(73) Assignee: GLOBALFOUNDRIES U.S. Inc., Malta, NY (US)

(*) Notice: Subject to any disclaimer, the term of this patent is extended or adjusted under 35 U.S.C. 154(b) by 58 days.

(21) Appl. No.: 17/587,347

(22) Filed: Jan. 28, 2022

(65) Prior Publication Data
US 2023/0246093 A1    Aug. 3, 2023

(51) Int. Cl.
| | | |
|---|---|---|
| *H01L 29/73* | (2006.01) | |
| *H01L 29/732* | (2006.01) | |
| *H01L 29/08* | (2006.01) | |
| *H01L 29/10* | (2006.01) | |
| *H01L 29/66* | (2006.01) | |

(52) U.S. Cl.
CPC ........ *H01L 29/732* (2013.01); *H01L 29/0804* (2013.01); *H01L 29/1004* (2013.01); *H01L 29/66287* (2013.01)

(58) Field of Classification Search
CPC ............... H01L 29/732; H01L 29/0804; H01L 29/1004; H01L 29/66287
See application file for complete search history.

(56) References Cited

U.S. PATENT DOCUMENTS

| | | |
|---|---|---|
| 5,286,996 A | 2/1994 | Neudeck et al. |
| 6,767,798 B2 | 7/2004 | Kalnitsky et al. |
| 6,869,852 B1 | 3/2005 | Joseph et al. |
| 7,087,940 B2 | 8/2006 | Khater et al. |
| 7,119,416 B1 | 10/2006 | Adam et al. |
| 8,536,012 B2 | 9/2013 | Camillo-Castillo et al. |
| 8,716,096 B2 | 5/2014 | Chan et al. |
| 8,810,005 B1 | 8/2014 | Camillo-Castillo et al. |
| 2001/0017399 A1 | 8/2001 | Oda et al. |
| 2005/0151225 A1 | 7/2005 | Adam et al. |
| 2005/0236647 A1 | 10/2005 | Khater |
| 2006/0231924 A1* | 10/2006 | Adam ................. H01L 29/7378 438/320 |
| 2011/0312147 A1* | 12/2011 | Harame ............ H01L 29/66242 257/E21.37 |
| 2013/0313614 A1 | 11/2013 | Fu et al. |
| 2014/0246676 A1* | 9/2014 | Camillo-Castillo ........................ H01L 29/66242 438/312 |
| 2018/0040611 A1 | 2/2018 | Jain et al. |

OTHER PUBLICATIONS

EP Search Report in EP Application No. 22200707.2-1212 dated Jun. 28, 2023, 11 pages.

\* cited by examiner

*Primary Examiner* — Syed I Gheyas
(74) *Attorney, Agent, or Firm* — Andrew M. Calderon; Calderon Safran & Cole, P.C.

(57) ABSTRACT

The present disclosure relates to semiconductor structures and, more particularly, to a bipolar transistor and methods of manufacture. The structure includes: a collector region in a semiconductor substrate; a base region adjacent to the collector region; and an emitter extending above the base region and comprising semiconductor material and a hardmask surrounding a lower portion of the semiconductor material.

20 Claims, 9 Drawing Sheets

BIPOLAR TRANSISTOR

This invention was made with government support under DARPA T-MUSIC AGREEMENT HR0011-20-3-0002 awarded by DARPA. The government may have certain rights in the invention.

FIELD OF THE INVENTION

The present disclosure relates to semiconductor structures and, more particularly, to a bipolar transistor and methods of manufacture.

Bipolar transistors can be vertical transistors or lateral transistors. Vertical silicon bipolar junction transistors (BJT) and SiGe heterojunction bipolar transistors (HBT) are preferred for high performance applications including, for example, mm-wave power amplifiers and low noise amplifiers, automotive radars and optical interconnects. These devices can attain very high fT (current gain cut-off frequency) and high fmax (power gain cut off frequency) values compared to CMOS. Typically, these devices are formed in the bulk substrate or in a cavity touching a handle wafer for a semiconductor-on-insulator (SOI) substrate, which raises cost and process complexity. It also creates problems of adjacent device isolation and leakage which requires additional processing steps and scalability issues.

SUMMARY

In an aspect of the disclosure, a structure comprises: a collector region in a semiconductor substrate; a base region adjacent to the collector region; and an emitter extending above the base region and comprising semiconductor material and a hardmask surrounding a lower portion of the semiconductor material.

In an aspect of the disclosure, a structure comprises: a collector region in a semiconductor substrate; a base region adjacent to the collector region; and a vertical emitter extending above the base region and comprising a stepped region with a reduced cross-sectional area at a lower portion and which contacts the base region.

In an aspect of the disclosure, a method comprises: forming a collector region in a semiconductor substrate; forming a base region adjacent to the collector region; and forming an emitter extending above the base region and comprising semiconductor material and a hardmask surrounding a lower portion of the semiconductor material.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to a bipolar transistor and methods of manufacture. More specifically, the present disclosure relates to an NPN bipolar device. In embodiments, the NPN bipolar device may comprise an oxide, nitride, polysilicon emitter region. Advantageously, the bipolar device is scalable beyond current lithography capabilities in order to provide additional space for base and collector contacts.

In embodiments, the bipolar device may be scalable beyond lithography capabilities due to many factors including, e.g., (i) a tapered nitride etching process, e.g., reactive ion etching (RIE), which is capable of shrinking the critical dimensions, (ii) the use of a polysilicon spacer (which may be made wider as needed to compensate for undercut during wet etching processes in a trench), and/or (iii) improved manufacturability and controls. For example, as to the improved manufacturability and controls, the etching processes can land in a nitride material which provides a margin for variability in the film stack thicknesses. In embodiments, the polysilicon spacer may also be used to block (e.g., control) emitter trench expansion during wet etching processes.

The bipolar transistor of the present disclosure can be manufactured in a number of ways using a number of different tools. In general, though, the methodologies and tools are used to form structures with dimensions in the micrometer and nanometer scale. The methodologies, i.e., technologies, employed to manufacture the bipolar transistor of the present disclosure have been adopted from integrated circuit (IC) technology. For example, the structures are built on wafers and are realized in films of material patterned by photolithographic processes on the top of a wafer. In particular, the fabrication of the bipolar transistor uses three basic building blocks: (i) deposition of thin films of material on a substrate, (ii) applying a patterned mask on top of the films by photolithographic imaging, and (iii) etching the films selectively to the mask.

Figure 1:
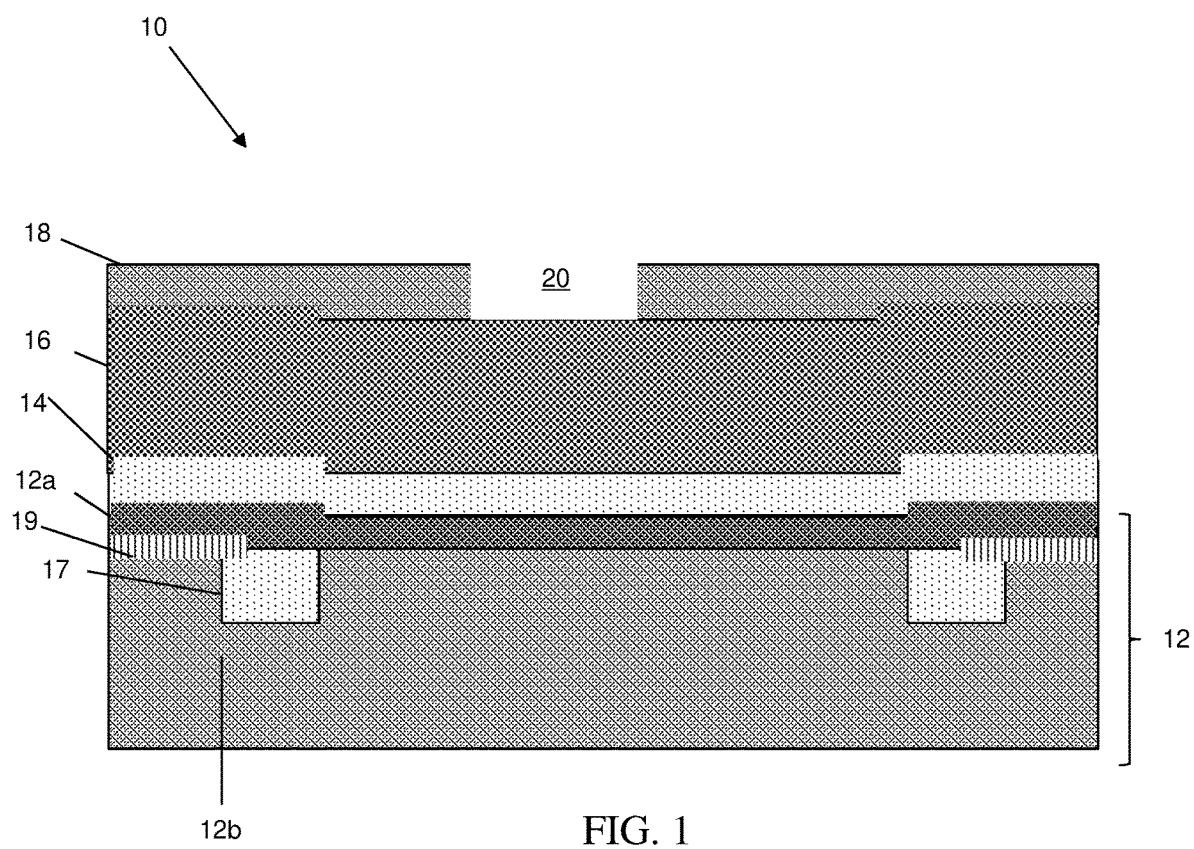
FIG. 1 shows a beginning structure and respective fabrication processes in accordance with aspects of the present disclosure.

FIG. 1 shows a beginning structure and respective fabrication processes in accordance with aspects of the present disclosure. As shown in FIG. 1, the structure 10 includes a substrate 12 composed of any suitable material including, but not limited to, Si, SiGe, SiGeC, SiC, GaAs, InAs, InP, and other III/V or II/VI compound semiconductors. In embodiments, the substrate 12 may include an intrinsic base 12a and a collector region 12b as is known in the art. In embodiments, the intrinsic base 12a may be an epaxially grown semiconductor with a p-type doping. An insulator material 19, e.g., nitride or oxide material, may also be provided over the collector region 12b.

More specifically, for a vertical bipolar NPN transistor, the substrate 12 may be bulk Si or SiGe of n-type doping with an intrinsic base 12a of Si or SiGe, or Ge or other semiconductor material having doping with a p-type material such as boron (B) and, optionally, may contain a carbon (C) layer to reduce boron out-diffusion during subsequent processing. In this implementation, the collector region 12b may be a N+ doped semiconductor material, where doping can be Phosphorus (P) or Arsenic (As) or both, as is known in the art. For a PNP vertical bipolar, the substrate 12 may be bulk Si or SiGe p-type doped, with an intrinsic base 12a comprising a semiconductor with doping of a n-type material such As or P.

Still referring to FIG. 1, shallow trench isolation structures 17 may be formed in the substrate 12 and, more specifically, in the collector region 12b. In embodiments, the shallow trench isolation structures 17 can be formed by conventional lithography, etching and deposition methods known to those of skill in the art. For example, a resist formed over the material of the collector region 12b is exposed to energy (light) to form a pattern (opening(s)). An etching process with a selective chemistry, e.g., reactive ion etching (RIE), will be used to transfer the pattern from the photoresist layer to the collector region 12b to form one or more trenches in the substrate 12 through the openings of the resist. Following the resist removal by a conventional oxygen ashing process or other known stripants, the insulator material (e.g., oxide) can be deposited by any conventional deposition processes, e.g., chemical vapor deposition (CVD) processes. Any residual material on the surface of the substrate (e.g., collector region 12b) can be removed by conventional chemical mechanical polishing (CMP) processes. The intrinsic base 12 may be grown over the shallow trench isolation structures 17 and collector region 12b.

FIG. 1 further shows an insulator material 14 formed over the substrate 12. In embodiments, the insulator material 14 may be an oxide material deposited using conventional deposition methods, e.g., chemical vapor deposition (CVD). The oxide could be between 5 nm to 40 nm thick, although other dimensions are contemplated herein. A hardmask 16 may be formed over the insulator material 14. The hardmask 16 may be a nitride material deposited to a thickness of, e.g., about 20 nm to 70 nm, using a CVD process. A photoresist 18 may be deposited over the hardmask 16, with an opening 20 defined in the photoresist 18. In embodiments, the opening 20 may be defined by, for example, conventional immersion lithography processes as is known in the art such that no further explanation is required for a complete understanding of the present disclosure.

Figure 2:
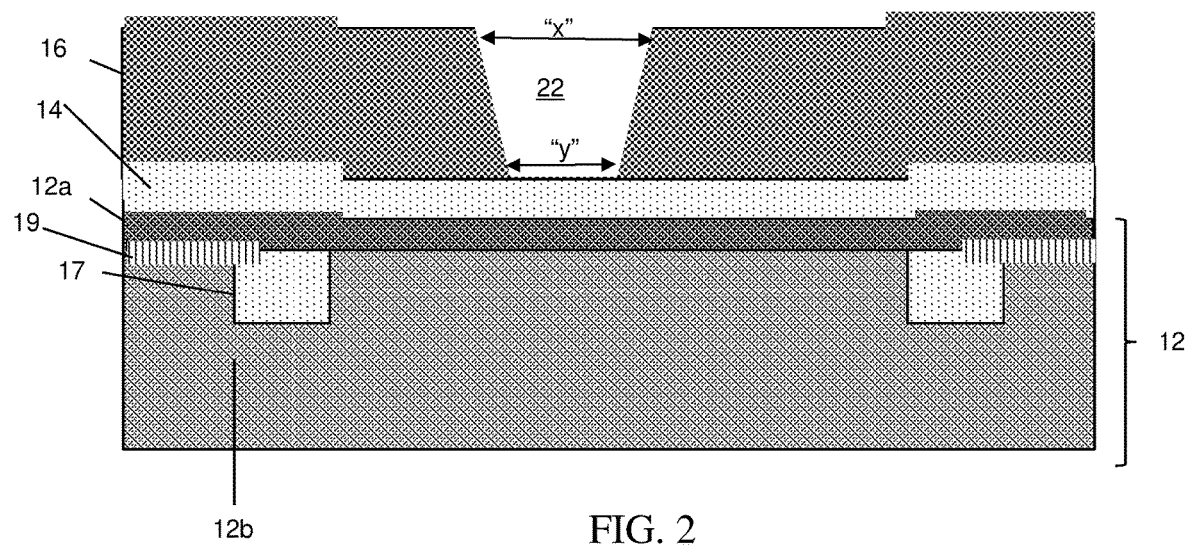
FIG. 2 shows a tapered trench formed in a hardmask, amongst other features, and respective fabrication processes in accordance with aspects of the present disclosure.

In FIG. 2, a trench 22 may be formed in the hardmask 16, e.g., nitride material. In embodiments, the trench 22 may be a tapered trench formed by etching processes (e.g., reactive ion etching (RIE)) through the opening 20 of the resist. The tapered profile may be formed by a combination of etchants, e.g., $CHF_3/O_2$, which selectively etches nitride, for example. In embodiments, a ratio between the two gases, e.g., $CHF_3/O2$, may be adjusted to tailor the final tapered profile. For example, by adjusting the ratio of the two gases, it is possible to scale or reduce the size of the trench 22, with the dimension "y" being smaller than the lithographic tooling/capability.

In embodiments, the tapered profile of the trench 22 includes a smaller opening "y" at a bottom of the trench than the wider opening "x" at the top (which is opposite to conventional tapered profiles). For example, the width (or cross-sectional distance) "x" may be about 20 nm to 150 nm and the width (or cross-sectional distance) "y" may be about 10 nm to 30 nm or smaller (e.g., x>y). It should be understood that other dimensions are contemplated herein by adjusting the parameters of the etchant chemistry or thickness of the hardmask 16, e.g., nitride material. As to the latter feature, for example, by using a thicker layer of hardmask 16, e.g., nitride material, it is possible to reduce the width "y" at the bottom of the trench 22. The photoresist may be stripped from a surface of the hardmask 16 after the etching process using conventional oxygen ashing processes or other stripants known to those of skill in the art.

Figure 3:
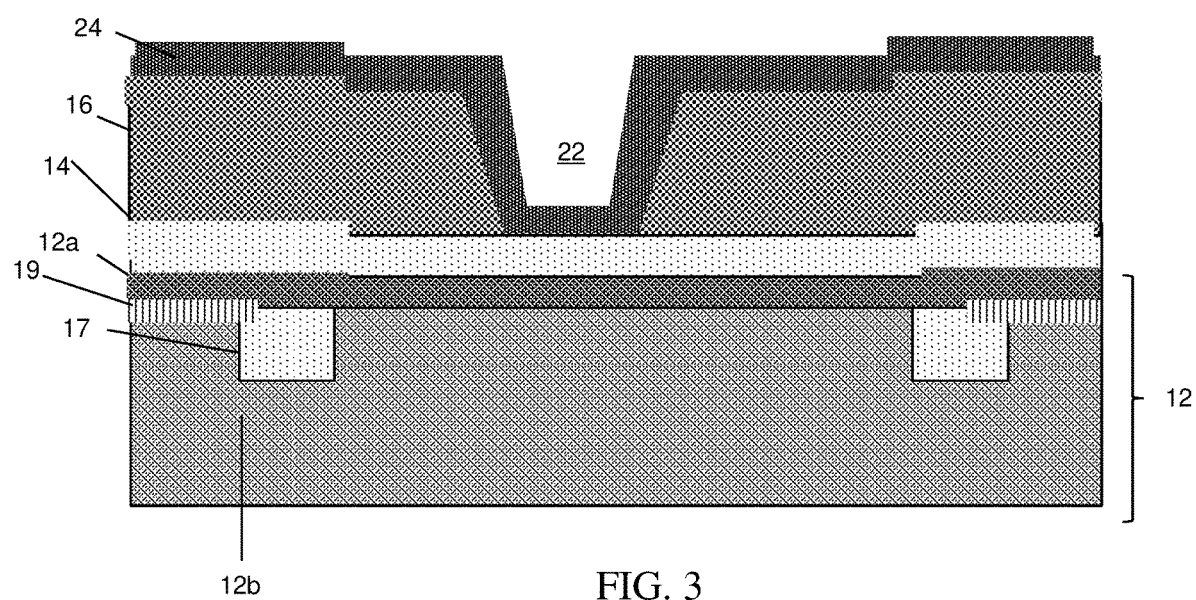
FIG. 3 shows semiconductor material on the hardmask and within the tapered trench, amongst other features, and respective fabrication processes in accordance with aspects of the present disclosure.

In FIG. 3, a semiconductor material 24 may be formed on the hardmask 16 and within the trench 22. In embodiments, the semiconductor material 24 may be polysilicon material deposited to a thickness which does not pinch-off the opening of the trench 22. For example, in embodiments, the semiconductor material 24 may be deposited to a thickness of about 30 nm or less. It should be understood, though, that other dimensions are also contemplated herein depending on the width of the trench 22 and the desired width of a subsequently formed trench in the oxide material 14 (which is used for emitter formation). The semiconductor material 24 may be doped as deposited, most preferably the same doping type as the emitter, e.g., n-type for a NPN bipolar. It should be understood that a reduced width of the subsequently formed trench (used to form a lower portion of a vertical emitter) will provide additional space to form a spacer and grow an extrinsic base region and form contacts as described in more detail below.

Figure 4:
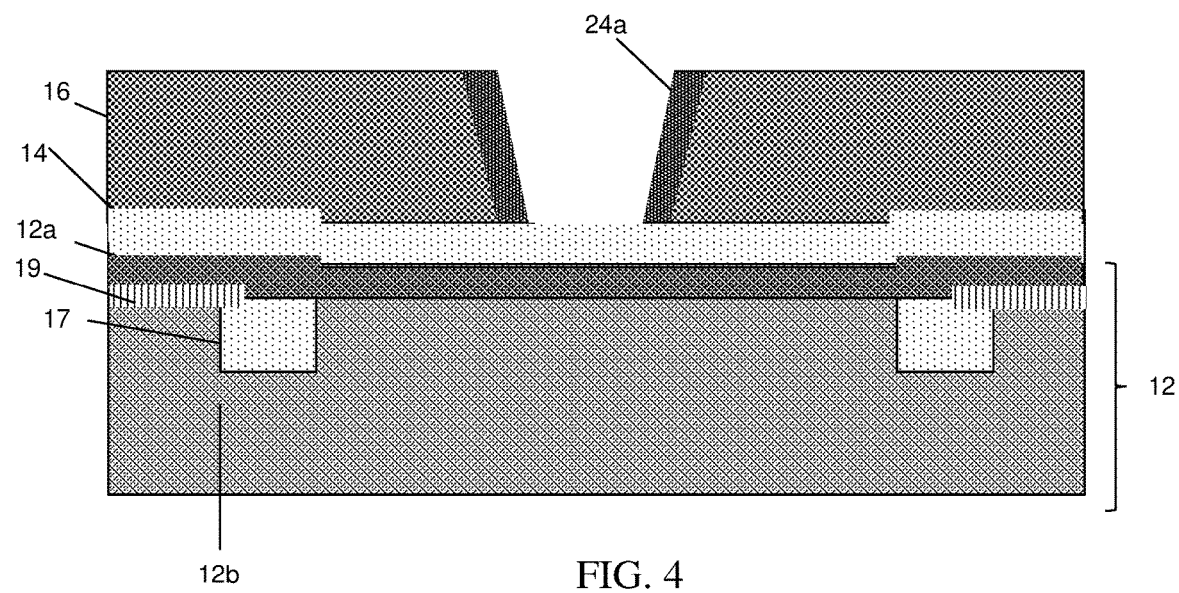
FIG. 4 shows sidewall spacers in the tapered trench, amongst other features, and respective fabrication processes in accordance with aspects of the present disclosure.

As shown in FIG. 4, the semiconductor material 24 may be removed from the top surface of the hardmask 16, e.g., nitride material, and bottom surface of the trench 22, e.g., over the oxide material 14. In embodiments, the semiconductor material 24 may be partially removed by use of conventional anisotropic etching processes. In this way, sidewall spacers 24a may be provided on the sidewalls of the trench 22, with the oxide material 14 exposed at a bottom of the trench 22. It should be understood by those of ordinary skill in the art that the thickness of the sidewall spacers 24a may be tuned by adjusting the overall thickness of the semiconductor material 24 during the deposition process which, in turn, can be used to tune the width of a subsequently formed emitter trench as shown in FIG. 5, for example.

Figure 5:
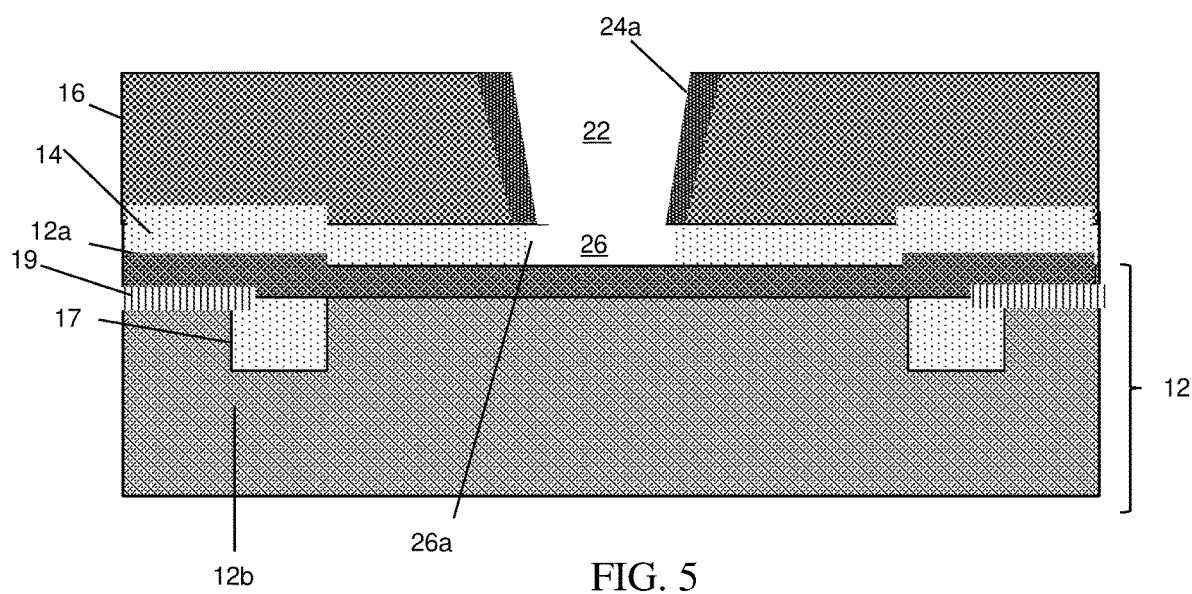
FIG. 5 shows a trench in oxide material and aligned with the sidewall spacers, amongst other features, and respective fabrication processes in accordance with aspects of the present disclosure.

In FIG. 5, the exposed oxide material 14 may be subjected to a removal process, e.g., wet etching process, to form trench 26 in the oxide material 14 and expose the top of the intrinsic base 12a. In embodiments, the trench 26 is self-aligned with the sidewall spacers 24a and may extend to the substrate 12, e.g., expose the substrate 12. The polysilicon spacer, e.g., sidewall spacers 24a, may be used to block (e.g., control) emitter trench expansion during wet etching processes. Also, as should be understood by those of skill in the art, the width of the trench 26 may be defined by the thickness of the sidewall spacers 24a. For example, a thicker sidewall spacer 24a, in turn, may result in a smaller width (cross-sectional area) of the trench 26. In this way, it is possible to scale the opening of the trench 26 beyond the critical dimensions of current lithography capabilities in order to reduce a width of the emitter and, hence, allow additional space to form an extrinsic base and form contacts to the extrinsic base region and/or collector region of the bipolar transistor.

In embodiments, the oxide material 14 may be subjected to an aggressive wet etching process with no critical dimension extension due to the sidewall spacers 24a, e.g., polysilicon material. For example, in embodiments, an aggressive wet etching process may result in an optional undercut 26a in the oxide material 14 under the sidewall spacers 24a, e.g., polysilicon material. In this way, the etching process may be used to scale the width of the tapered trench 26, thereby allowing for additional space for the contacts to the extrinsic base region and/or collector region of the bipolar transistor.

Figure 6:
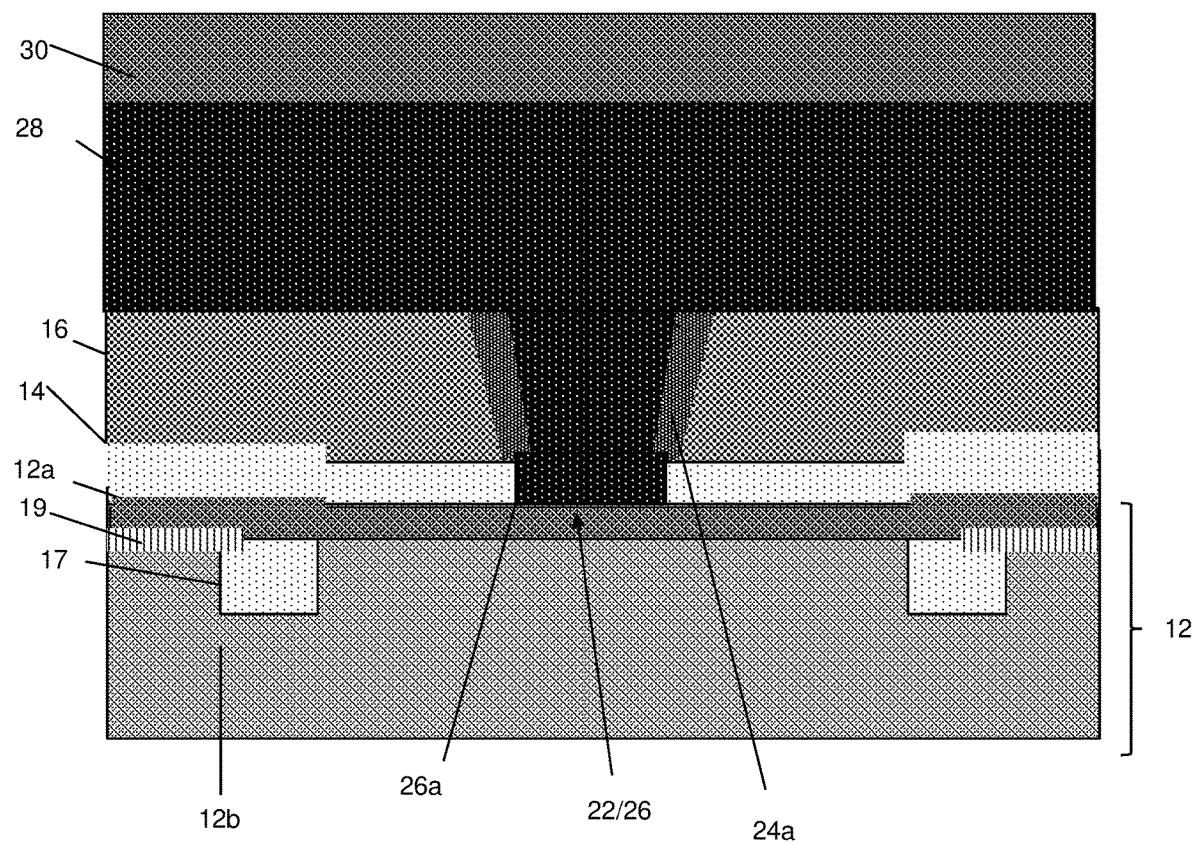
FIG. 6 shows an emitter material over the hardmask and within the trenches, amongst other features, and respective fabrication processes in accordance with aspects of the present disclosure.

As shown in FIG. 6, an emitter material 28 may be formed over the hardmask 16, e.g., nitride material, sidewall spacers 24a and within the trenches 22, 26. In embodiments, the emitter material 28 may be semiconductor material epitaxially grown within the trenches 22, 26. Illustratively, the semiconductor material may be single crystalline semiconductor material on the intrinsic base 12a to provide a low contact resistance, e.g., a couple of ohms, with polysilicon material on the hardmask 16 and upper regions farther away from the intrinsic base 12a. The emitter material 28 may be epitaxially grown, with an N+ in-situ doping process. For example, the in-situ doping process includes an n-type dopant, e.g., arsenic, phosphorous, Sb, etc., for an NPN device. The sidewalls spacers 24a may also be N+ doped, which is a different doping than the intrinsic base 12a. Prior to the oxide material 14 removal and emitter deposition, the sidewall spacers 24a may be subjected to additional heavy N-type doping via implantation resulting in extremely low resistance of the poly spacer material.

FIG. 6 further shows a hardmask material (capping material) 30 formed, e.g., deposited, on the emitter material 28. In embodiments, the hardmask material 30 may be a nitride material or other dielectric material, e.g., oxide material, deposited by a conventional deposition method such as CVD.

Figure 7:
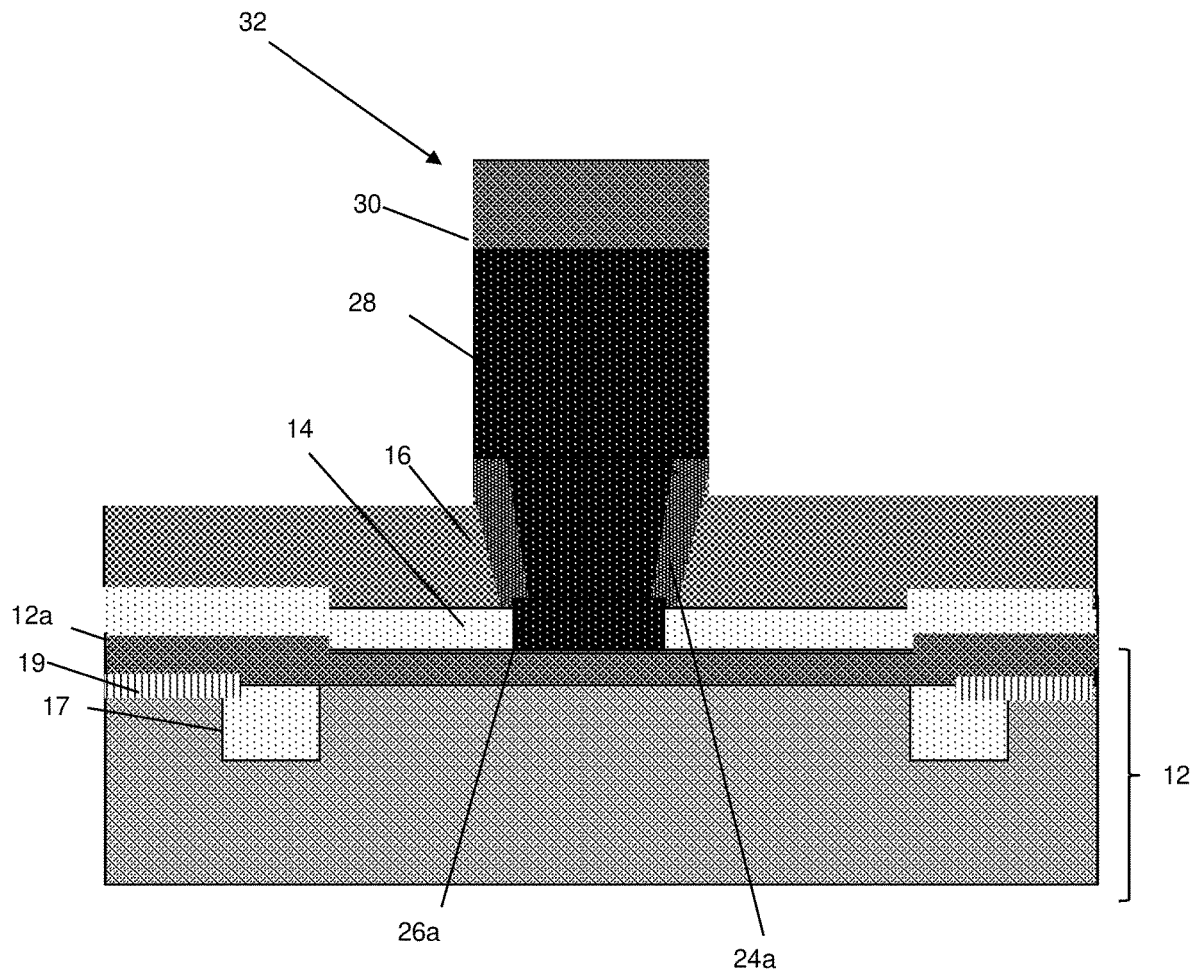
FIG. 7 shows a vertical emitter, amongst other features, and respective fabrication processes in accordance with aspects of the present disclosure.

In FIG. 7, a portion of the vertical emitter 32 may be formed from the emitter material 28. For example, in embodiments, the emitter 32 may be formed by a non-selective anisotropic etching process, e.g., non-selective polysilicon RIE process. It is noted that the non-selective polysilicon RIE process may be a timed etching process which stops in the hardmask 16 (above the oxide layer 14). In embodiments, the timed process may slightly over etch into the hardmask 16; however, this will not affect the desired final emitter profile as the hardmask 16 is thick enough to prevent punch through effects of the oxide layer underneath.

Figure 8:
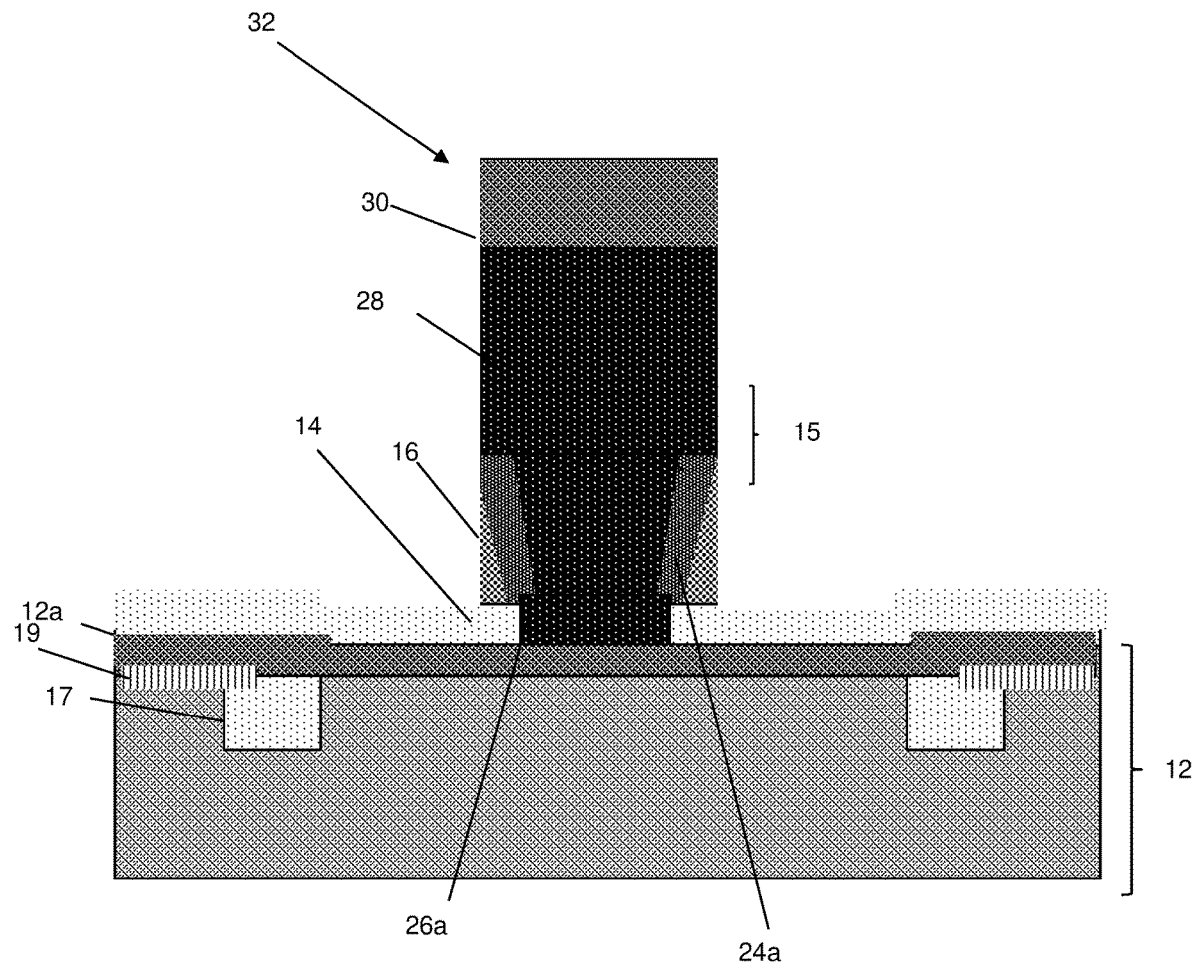
FIG. 8 shows the emitter with lower sidewall spacers and reduced cross-sectional area, amongst other features, and respective fabrication processes in accordance with aspects of the present disclosure.

In FIG. 8, a nitride etching process may be performed to remove the hardmask 16 over the oxide material 14. As shown, though, some material of the hardmask 16 may remain under a portion of the emitter material 28. In this way, the emitter 32 includes the polysilicon material, e.g., emitter material 28, with lower sidewall spacers comprising the sidewall spacers 24a, e.g., polysilicon material, and hardmask 16, e.g., nitride (and oxide). Accordingly, the emitter 32 comprises oxide, nitride and polysilicon.

In embodiments, the sidewall spacers 24a, e.g., polysilicon material, may be part of the emitter 32, itself, with the hardmask 16 being an insulative ring or collar around, e.g., in direct contact and surrounding, the lower portion of the emitter 32 (e.g., sidewall spacers 24a that are part of the emitter). In addition, the ring of hardmask 16 may be planar with the surface of the emitter 32 above the hardmask 16.

In embodiments, the emitter 32 comprises a stepped portion 15, with the lower portion (below the stepped portion 15) of the emitter comprising a smaller (reduced) cross-sectional area than an upper portion (above the stepped portion 15) of the emitter 32. In this way, it is now possible to provide additional area for extrinsic base growth and contacts to the base region, as the lower portion of the emitter has a reduced cross-sectional area, e.g., smaller than an area of the intrinsic base 12a. And the reduced cross-sectional area at the lower portion can be tuned, e.g., made smaller, by adjusting the width of the trench 26 as already described. For example, a smaller-cross sectional area for the lower portion of the emitter 32 may be provided in different ways including, e.g., (i) making the sidewall spacer 24a thicker, (ii) making the hardmask 26 thicker, which will effectively reduce the width "y" of the tapered trench 22, and/or (iii) adjusting the etch chemistry used to form the tapered trench 22.

Figure 9:
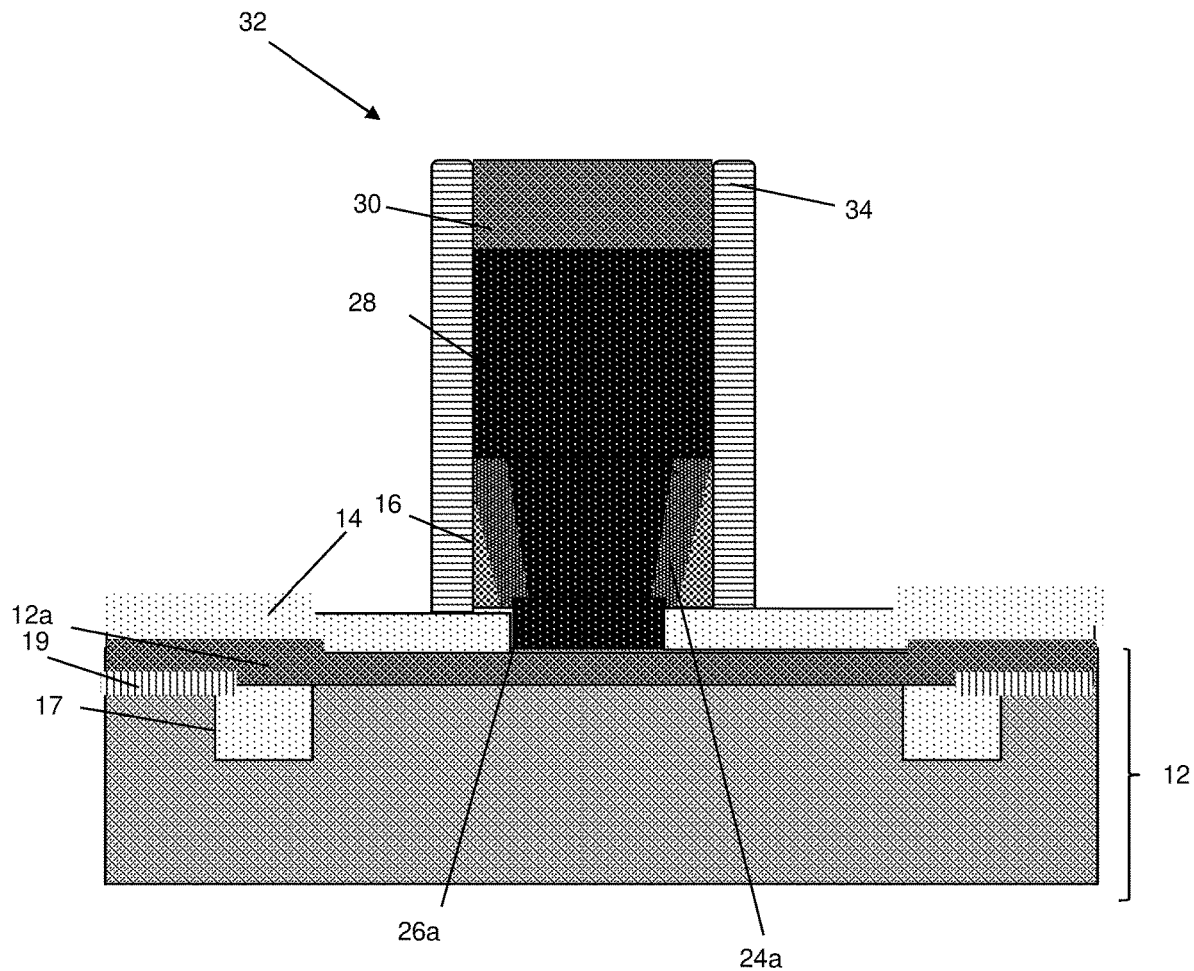
FIG. 9 shows an additional sidewall spacer on the emitter, amongst other features, and respective fabrication processes in accordance with aspects of the present disclosure.

In FIG. 9, a sidewall spacer 34 may be formed on the sidewalls of the emitter 32. For example, a nitride and/or oxide material may be blanket deposited on the emitter 32 and oxide material 14, followed by an anisotropic etching process. In this way, the emitter 32 is also surrounded by the sidewall spacer 34 and the oxide material 14, both of which act as a spacer about the emitter 32. In embodiments, the oxide material 14 is also a ring or collar which surrounds the emitter 32, with the hardmask 16 above the oxide material 14 at a lower portion of the emitter 32. The sidewall spacer 34 encapsulates the emitter 32, including the hardmask 16, and the sidewall spacers 24a, e.g., polysilicon material. The sidewall spacer 34 and the oxide material 14 may be the same material.

Figure 10:
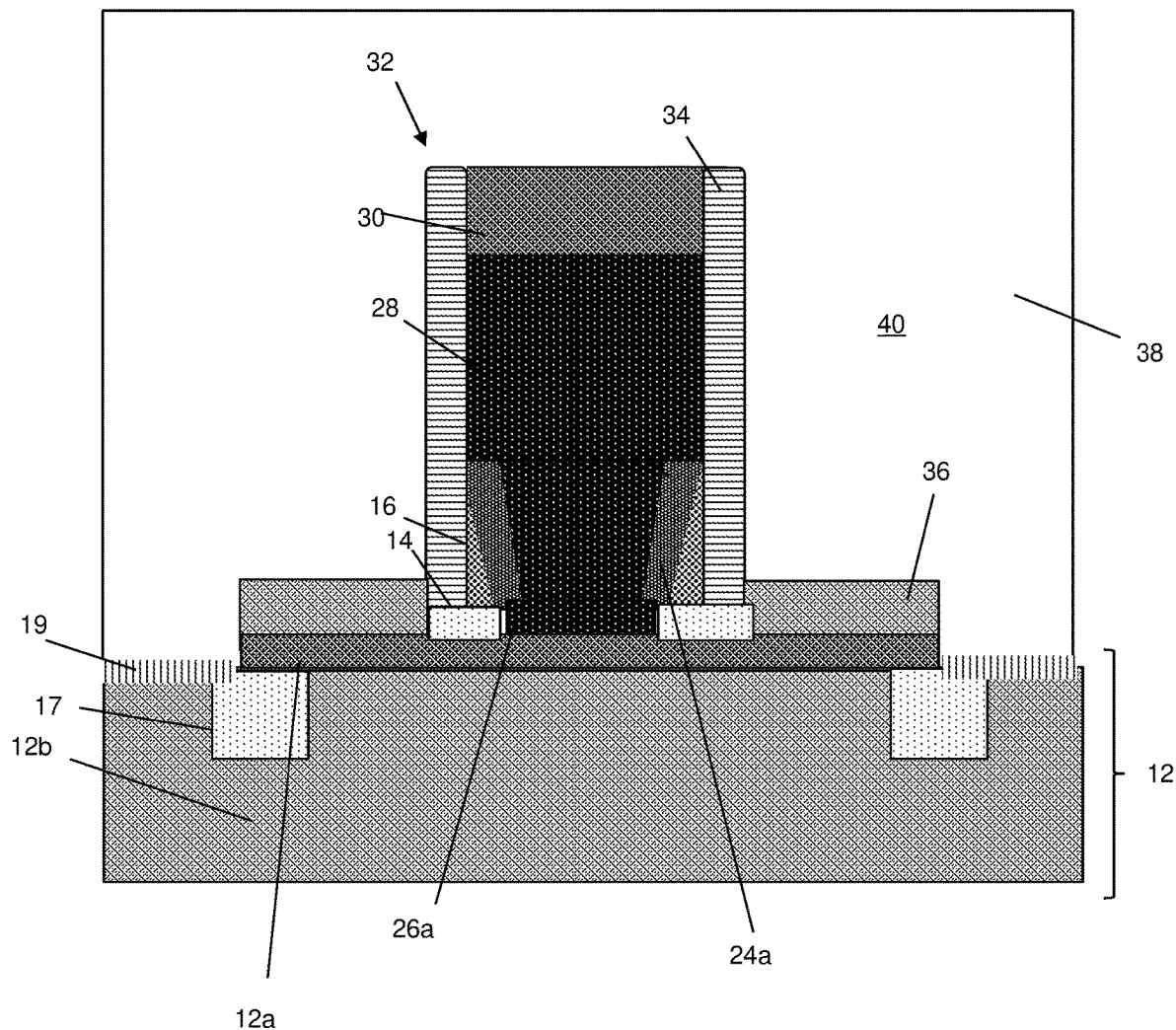
FIG. 10 shows an extrinsic base, amongst other features, and respective fabrication processes in accordance with aspects of the present disclosure.

As shown in FIG. 10, portions of the oxide material 14 and the intrinsic base 12a may be removed from the areas where the collector contact will be formed. In embodiments, the portions of oxide material 14 and intrinsic base 12a may be removed by conventional lithography, etching and/or wet processes. To expose the underlying substrate 12a, e.g., intrinsic base, a wet etch can be done to remove the material 14, e.g., oxide.

A raised extrinsic base 36 may be formed on the exposed underlying substrate 12, e.g., intrinsic base 12a. In embodiments, the extrinsic base 36 may be formed by a selective conventional epitaxial growth process, e.g., Si material grown on the underlying substrate 12, e.g., intrinsic base 12a. In embodiments, the extrinsic base 36 may be p-type doped material, which may be formed in in-situ with the epitaxial growth process. Doping can be achieved by incorporating Boron into the extrinsic base 36. As shown, the extrinsic base 36 may be separated from the emitter 32 by the sidewall spacers 34, but still capable of contacting the underlying intrinsic base 12a due to the reduced size of the emitter 32 at the lower portion. That is, due to the reduced area of the emitter 32 it is now possible to closely place the extrinsic base 32 and connects 38 to the emitter 32. As an alternative option, a non-selective extrinsic base material may be deposited followed by a removal of portions outside of the underlying intrinsic base 12a.

Figure 11:
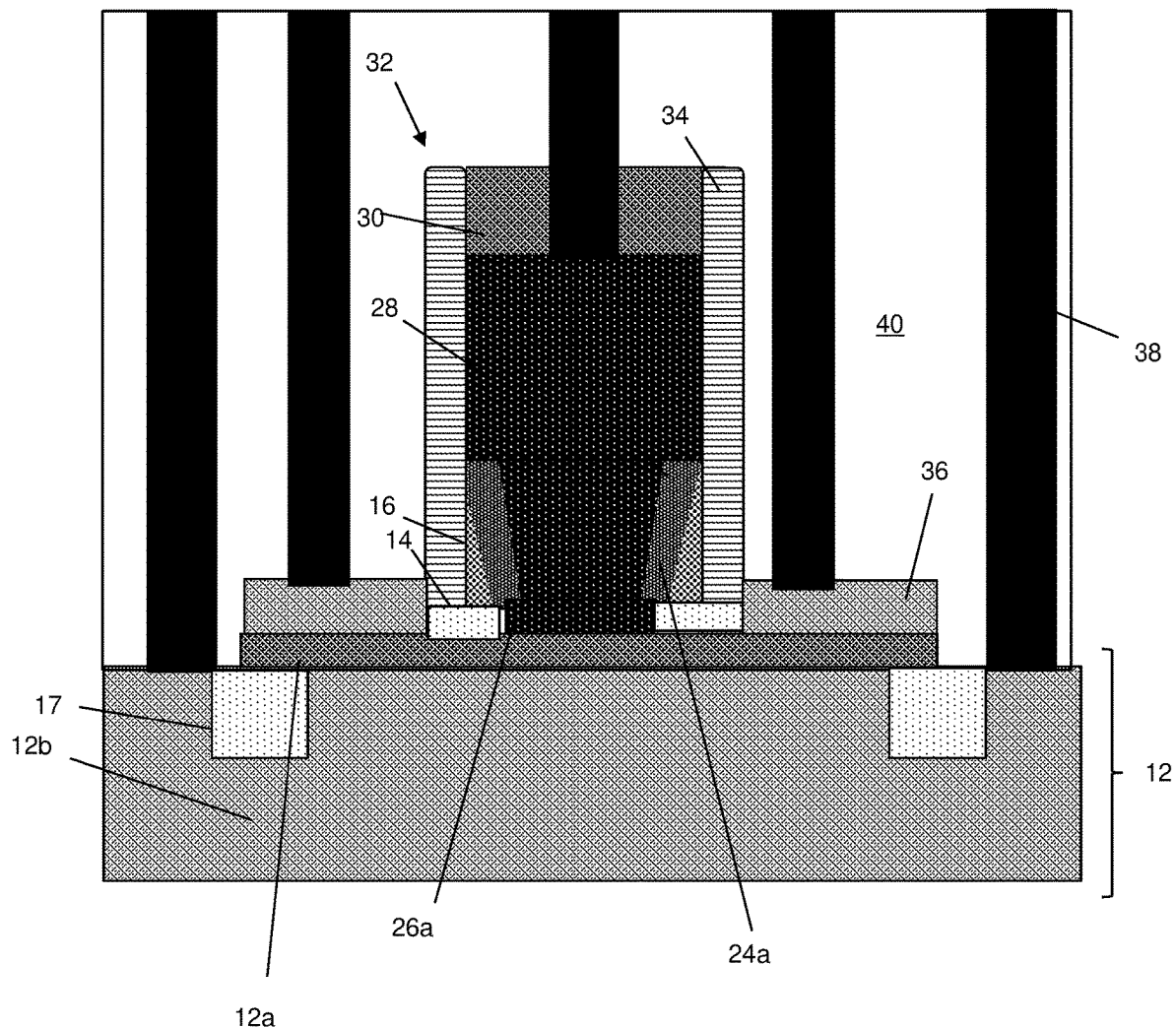
FIG. 11 shows and contacts, amongst other features, and respective fabrication processes in accordance with aspects of the present disclosure.

As shown in FIG. 11, the nitride or oxide material 19 may be removed by conventional lithography, etching and wet processes to expose the collector region 12b. In this way, it will be possible to connect contacts to the collector region 12b. An interlevel dielectric material 40, e.g., stack of oxide and nitride materials, may be formed over the structure. Vias may be formed in the interlevel dielectric material 40 (and hardmask 30) to expose the emitter 32, the extrinsic base 36 and collector region 12b. Contacts 38 may be provided to the emitter 32, the extrinsic base 36 and collector region 12b.

Prior to forming the contacts 38, a silicide process may be formed on the semiconductor material of the extrinsic base 36, the collector region (e.g., semiconductor material 12b) and, optionally, the emitter 32. As should be understood by those of skill in the art, the silicide process begins with deposition of a thin transition metal layer, e.g., nickel, cobalt or titanium, over fully formed and patterned semiconductor material. After deposition of the transition metal layer, the structure is heated allowing the transition metal to react with exposed semiconductor material forming a low-resistance transition metal silicide, e.g., NiSi. Following the reaction, any remaining transition metal is removed by chemical etching, leaving the silicide contacts on the semiconductor material of the extrinsic base 36 and the collector region (semiconductor material 12b) and, optionally, the emitter 32. The contacts 38 may be formed by depositing conductive material, e.g., tungsten, aluminum, etc., within the vias using conventional CVD processes. Any residual material on the interlevel dielectric material 40 may be removed by a CMP process.

The bipolar transistor can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multichip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
a collector region in a semiconductor substrate;
a base region adjacent to the collector region;
an emitter extending above the base region and comprising semiconductor material and hardmask material surrounding a lower portion of the semiconductor material and at a top surface of the semiconductor material of the emitter;
a sidewall spacer surrounding the semiconductor material of the emitter and the hardmask material at both the lower portion and the top surface; and
interlevel dielectric material over the hardmask material and the sidewall spacer.

2. The structure of claim 1, wherein the hardmask material comprises nitride.

3. The structure of claim 1, wherein the base region includes an intrinsic base comprising p-doped semiconductor material and an extrinsic base region of epitaxial p-doped semiconductor material on the intrinsic base.

4. The structure of claim 1, wherein the emitter comprises a stepped portion, with the lower portion comprising a smaller cross-section than an upper portion of the emitter.

5. The structure of claim 4, wherein the hardmask material comprises a collar of insulator material about the lower portion of the emitter.

6. The structure of claim 5, further comprising another insulator material under the hardmask material.

7. The structure of claim 6, wherein the insulator material comprises a collar at the lower portion of the emitter, below the collar of the hardmask material.

8. The structure of claim 7, wherein the insulator material comprises oxide material.

9. The structure of claim 8, wherein the lower portion of the semiconductor material contacts an intrinsic base of the base region.

10. The structure of claim 9, further comprising a raised extrinsic base of the base region, which is isolated from the emitter by at least the sidewall spacer.

11. The structure of claim 10, wherein the sidewall spacer covers and directly contacts the semiconductor material and the hardmask material surrounding the lower portion of the semiconductor material, and forms a collar around and contacts the hardmask material at the top surface.

12. A structure comprising:
a collector region in a semiconductor substrate;
a base region adjacent to the collector region; and
a vertical emitter extending above the base region and comprising a stepped region with a reduced cross-sectional area at a lower portion and which contacts the base region;
a sidewall spacer extending along a height of the sidewall of the vertical emitter to a top surface thereof; and
interlevel dielectric material over the sidewall spacer along the height of the sidewall to the top surface and over the vertical emitter.

13. The structure of claim 12, wherein the emitter comprises single crystalline semiconductor material.

14. The structure of claim 12, wherein the reduced cross-sectional area is below the stepped portion.

15. The structure of claim 14, further comprising a hardmask surrounding the lower portion of the emitter and between the sidewall spacer and a collar of insulator material.

16. The structure of claim 15, wherein the collar of insulator material under the hardmask is about the lower portion of the emitter.

17. The structure of claim 16, wherein the insulator material comprises oxide material.

18. The structure of claim 12, wherein the lower portion of the semiconductor material contacts an intrinsic base of the base region.

19. The structure of claim 12, wherein the sidewall spacer directly covers semiconductor material of the emitter and hardmask surrounding the lower portion of the semiconductor material and on a top surface of the emitter.

20. A method comprising:
    forming a collector region in a semiconductor substrate;
    forming a base region adjacent to the collector region; and
    forming an emitter extending above the base region and comprising semiconductor material and hardmask material surrounding a lower portion of the semiconductor material and at a top surface of the semiconductor material of the emitter;
    forming a sidewall spacer surrounding the semiconductor material of the emitter and the hardmask material at both the lower portion and the top surface; and
    forming interlevel dielectric material over the hardmask material and the sidewall spacer.

* * * * *